(12) United States Patent
Li et al.

(10) Patent No.: US 10,885,821 B2
(45) Date of Patent: Jan. 5, 2021

(54) INSPECTION DEVICE AND INSPECTION METHOD FOR ARRAY SUBSTRATE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Guangyao Li, Beijing (CN); Bo Mao, Beijing (CN); Xuehai Gui, Beijing (CN); Qinghe Wang, Beijing (CN); Jun Wang, Beijing (CN); Dongfang Wang, Beijing (CN); Liangchen Yan, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 86 days.

(21) Appl. No.: 16/399,859

(22) Filed: Apr. 30, 2019

(65) Prior Publication Data
US 2020/0066195 A1    Feb. 27, 2020

(30) Foreign Application Priority Data
Aug. 22, 2018    (CN) .......................... 2018 1 0960263

(51) Int. Cl.
*G09G 3/00*    (2006.01)
*G09G 3/3225*    (2016.01)
(Continued)

(52) U.S. Cl.
CPC ........... *G09G 3/006* (2013.01); *G09G 3/3225* (2013.01); *H01L 27/3211* (2013.01);
(Continued)

(58) Field of Classification Search
CPC ............ G09G 3/00; G09G 3/006; G09G 3/20; G09G 3/22; G09G 3/30; G09G 3/32;
(Continued)

(56) References Cited

U.S. PATENT DOCUMENTS 6,624,857 B1 *   9/2003   Nagata .................. G02F 1/1309
                                                            349/139
6,864,871 B1 *   3/2005   Okada .................... G09G 3/006
                                                            345/90
(Continued)

FOREIGN PATENT DOCUMENTS

CN          1375859 A       10/2002
CN        101044537 A        9/2007
(Continued)

OTHER PUBLICATIONS

First Office Action for Chinese Application No. 201801960263.5, dated Apr. 23, 2020, 8 Pages.

*Primary Examiner* — Hoai-An D. Nguyen
(74) *Attorney, Agent, or Firm* — Brooks Kushman P.C.

(57) ABSTRACT

An inspection device includes: a driving circuit, configured to input display data of an image to a pixel electrode of the array substrate; a light-emitting device comprising a first electrode, a second electrode, and a plurality of light-emitting units arranged between the first electrode and the second electrode, and the plurality of light-emitting units is capable of emitting light under the effect of an electric field between the first electrode and the second electrode; a test circuit, configured to electrically connect the first electrode of the light-emitting device to the pixel electrode of the array substrate, and input a first electrical signal to the second electrode of the light-emitting device, to generate the electric field; and a processing circuit, configured to acquire optical information of the light emitted by the light-emitting device,
(Continued)

and determine whether there is an electrical defect in the array substrate according to the optical information.

14 Claims, 2 Drawing Sheets

(51) Int. Cl.
*H01L 27/32* (2006.01)
*H01L 51/00* (2006.01)
*H01L 51/52* (2006.01)

(52) U.S. Cl.
CPC ...... *H01L 27/3244* (2013.01); *H01L 51/0031* (2013.01); *G09G 2320/0613* (2013.01); *H01L 51/5218* (2013.01); *H01L 51/5234* (2013.01)

(58) Field of Classification Search
CPC ............... G09G 3/3208; G09G 3/3225; G09G 2300/0426; G09G 2310/0235; G09G 2320/0242; G09G 2320/0613; H01L 22/00; H01L 22/10; H01L 22/12; H01L 22/14; H01L 22/30; H01L 22/34; H01L 2251/56; H01L 27/00; H01L 27/28; H01L 27/32; H01L 27/3206; H01L 27/3211; H01L 27/3241; H01L 27/3244; H01L 51/00; H01L 51/0001; H01L 51/0031; H01L 51/50; H01L 51/52; H01L 51/5203; H01L 51/5206; H01L 51/5218; H01L 51/5221

USPC ............. 324/500, 537, 555, 760.01, 760.02, 324/762.01, 762.07, 600, 649, 691, 713, 324/715, 718, 452, 456; 345/92; 702/1, 702/33, 35, 36
See application file for complete search history.

(56) References Cited

U.S. PATENT DOCUMENTS

| | | | |
|---|---|---|---|
| 7,105,365 B2* | 9/2006 | Hiroki | G09G 3/00 257/E27.111 |
| 9,140,937 B2* | 9/2015 | Rao | G02F 1/13439 |
| 2002/0132383 A1 | 9/2002 | Hiroki et al. | |
| 2006/0103414 A1 | 5/2006 | Tomita | |
| 2014/0333852 A1 | 11/2014 | Ishikawa et al. | |
| 2015/0077753 A1 | 3/2015 | Ji et al. | |
| 2016/0062206 A1* | 3/2016 | Paolini, Jr. | B29C 66/71 156/247 |

FOREIGN PATENT DOCUMENTS

| | | |
|---|---|---|
| CN | 101728397 A | 6/2010 |
| CN | 103969853 A | 8/2014 |
| JP | 2014219606 A | 11/2014 |

* cited by examiner

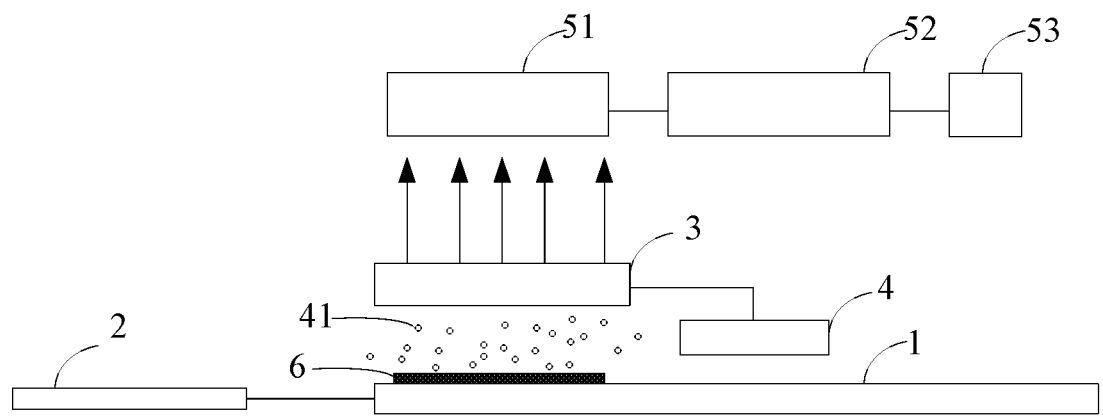
Fig. 1
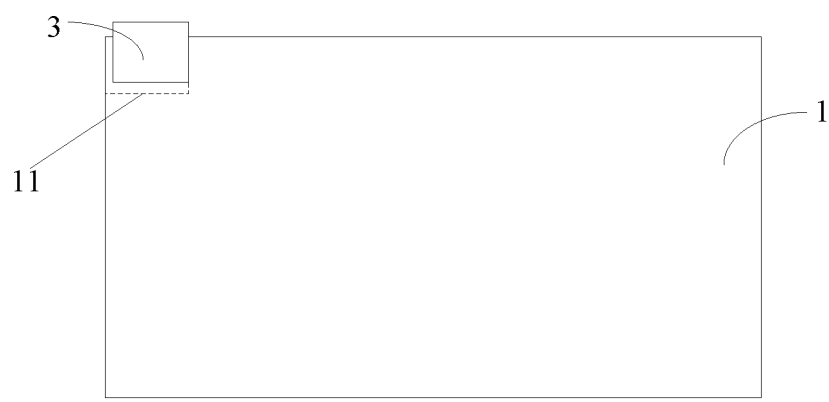
Fig. 2
Fig. 3

| 32 | | | | | | | | |
|---|---|---|---|---|---|---|---|---|
| 33R | 33B | 33G | 33R | 33B | 33G | 33R | 33B | 33G |
| 31 | | | | | | | | |

INSPECTION DEVICE AND INSPECTION METHOD FOR ARRAY SUBSTRATE

CROSS-REFERENCE TO RELATED APPLICATION

This application claims priority to Chinese Patent Application No. 201810960263.5 filed on Aug. 22, 2018, which is incorporated herein by reference in its entirety.

TECHNICAL FIELD

The present disclosure relates to the field of display technologies, and in particular to an inspection device and an inspection method for an array substrate.

BACKGROUND

In the related art, during a process of manufacturing a display substrate, after a Thin Film Transistor (TFT) has been formed, an inspection process for an array substrate is required to inspect whether there are electrical defects in pixels and signal lines after the formation of the TFT. However, the related art does not provide an inspection device capable of appropriately inspecting an array substrate of an Organic Light-emitting Diode (OLED) display substrate, and matching performance of the array substrate with the OLED display substrate in which an organic light-emitting layer has been subjected to an evaporation process.

SUMMARY

In one aspect, an embodiment of the present disclosure provides an inspection device for an array substrate, wherein the inspection device is configured to inspect a to-be-inspected array substrate, and includes: a driving circuit, configured to input display data of an image to a pixel electrode of the array substrate; a light-emitting device, wherein the light-emitting device includes a first electrode, a second electrode, and a plurality of light-emitting units arranged between the first electrode and the second electrode, and the plurality of light-emitting units is capable of emitting light under the effect of an electric field between the first electrode and the second electrode; a test circuit, configured to electrically connect the first electrode of the light-emitting device to the pixel electrode of the array substrate, and input a first electrical signal to the second electrode of the light-emitting device, to generate the electric field between the first electrode and the second electrode; and a processing circuit, configured to acquire optical information of the light emitted by the light-emitting device, and determine whether there is an electrical defect in the array substrate according to the optical information.

In an embodiment of the present disclosure, the processing circuit includes: an optical inspection device arranged at a light-emitting side of the light-emitting device, and configured to acquire optical information of the light emitted by the light-emitting device; a photoelectric conversion device connected to the optical inspection device, and configured to convert the optical information into a second electrical signal; and a processor, configured to determine whether there is the electrical defect in the array substrate according to the second electrical signal.

In an embodiment of the present disclosure, the light-emitting device includes a plurality of groups of light-emitting units, each of the groups of light-emitting units includes a plurality of light-emitting units capable of emitting lights in different colors respectively, and the lights emitted by the plurality of light-emitting units in each of the groups of light-emitting units are enabled to be mixed into white light; and the optical inspection device configured to acquire the optical information of the light emitted by the light-emitting device is further configured to acquire the optical information of the white light.

In an embodiment of the present disclosure, each of the groups of light-emitting units includes a red-light-emitting unit, a blue-light-emitting unit, and a green-light-emitting unit.

In an embodiment of the present disclosure, the test circuit is further configured to electrically connect the first electrode of the light-emitting device to the pixel electrode of the array substrate through a probe, the pixel electrodes are in one-to-one correspondence with the first electrodes, and each of the pixel electrodes is electrically connected to a respective one of the first electrodes.

In an embodiment of the present disclosure, the light-emitting device and the array substrate are arranged in a sealed test chamber, the first electrode of the light-emitting device is oriented towards the array substrate, and a distance between the first electrode and the array substrate is less than a threshold; and the test circuit is further configured to dispose conductive particles into a space between the first electrode and the array substrate, to transmit a third electrical signal of the pixel electrode of the array substrate to the first electrode through the conductive particles.

In an embodiment of the present disclosure, the first electrode is made of a reflective and conductive material, the second electrode is made of a transparent and conductive material, and the light emitted by the light-emitting unit is transmitted through the second electrode.

An embodiment of the present disclosure further provides a method for inspecting an array substrate, wherein the method is applied to the inspection device for the array substrate as described above, and configured to inspect the to-be-inspected array substrate, and the method includes: inputting the display data of the image to the pixel electrode of the array substrate; electrically connecting the first electrode of the light-emitting device to the pixel electrode of the array substrate, and inputting the first electrical signal to the second electrode of the light-emitting device, to generate the electric field between the first electrode and the second electrode to drive the light-emitting device to emit the light; and acquiring the optical information of the light emitted by the light-emitting device, and determining whether there is the electrical defect in the array substrate according to the optical information.

In an embodiment of the present disclosure, an area of the light-emitting device is smaller than an area of the array substrate, and the method further includes: dividing the area of the array substrate into a plurality of sub-regions of the array substrate; and with respect to each of the plurality of sub-regions, moving the light-emitting device to a position above the sub-region, electrically connecting the first electrode of the light-emitting device to the pixel electrode of the sub-region, and inputting the first electrical signal to the second electrode of the light-emitting device, to acquire the optical information of the light emitted by the light-emitting device.

In an embodiment of the present disclosure, an area of each of the plurality of sub-regions is equal to an area of the light-emitting device.

In an embodiment of the present disclosure, at least two of the plurality of sub-regions partially overlap each other.

In an embodiment of the present disclosure, electrically connecting the first electrode of the light-emitting device to the pixel electrode of the array substrate includes: electrically connecting the first electrode of the light-emitting device to the pixel electrode of the array substrate through a probe, the pixel electrodes are in one-to-one correspondence with the first electrodes, and each of the pixel electrodes is electrically connected to a respective one of the first electrodes.

In an embodiment of the present disclosure, electrically connecting the first electrode of the light-emitting device to the pixel electrode of the array substrate includes: placing the light-emitting device and the array substrate into a sealed test chamber; orienting the first electrode of the light-emitting device toward the array substrate, and enabling a distance between the first electrode and the array substrate to be less than a threshold; and disposing conductive particles in a space between the first electrode and the array substrate, to transmit a third electrical signal of the pixel electrode of the array substrate to the first electrode through the conductive particles.

In an embodiment of the present disclosure, determining whether there is the electrical defect in the array substrate according to the optical information includes: converting the optical information into a second electrical signal by using a photoelectric conversion device, and determining whether there is the electrical defect in the array substrate according to the second electrical signal.

BRIEF DESCRIPTION OF THE DRAWINGS

FIG. 1 is a schematic diagram of an inspection device for an array substrate according to an embodiment of the present disclosure.

FIG. 2 is a schematic diagram of a light-emitting device according to an embodiment of the present disclosure.

FIG. 3 is a schematic diagram for moving the light-emitting device to a position above a first region of the array substrate according to an embodiment of the present disclosure.

DETAILED DESCRIPTION

Figures 4, 5:
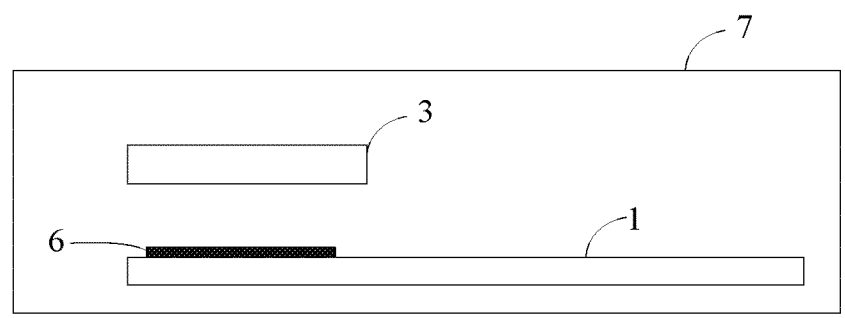
FIG. 4 is a schematic diagram of the array substrate and the light-emitting device arranged in a sealed test chamber according to an embodiment of the present disclosure.
FIG. 5 is a schematic diagram of the light-emitting device including a plurality of groups of light-emitting units according to an embodiment of the present disclosure.

In order to make technical problems, technical solutions and advantages to be solved by the embodiments of the present disclosure more clear, detailed description will be made below in conjunction with the accompanying drawings and specific embodiments.

The embodiments of the present disclosure provide an inspection device and an inspection method for an array substrate, so as to inspect the array substrate of an OLED display substrate after a TFT has been formed, and matching performance of the array substrate with the OLED display substrate in which an organic light-emitting layer has been subjected to an evaporation process.

An embodiment of the present disclosure provides an inspection device for an array substrate, wherein the inspection device is configured to inspect a to-be-inspected array substrate, and includes: a driving circuit, configured to input display data of a predetermined image to the array substrate; a light-emitting device, wherein the light-emitting device includes a first electrode, a second electrode, and a plurality of light-emitting units arranged between the first electrode and the second electrode, and the plurality of light-emitting units is capable of emitting light under the effect of an electric field between the first electrode and the second electrode; a test circuit, configured to electrically connect the first electrode of the light-emitting device to the pixel electrode of the array substrate, and input a predetermined electrical signal to the second electrode of the light-emitting device, to generate the electric field between the first electrode and the second electrode; and a processing circuit, configured to acquire optical information of the light emitted by the light-emitting device, and determine whether there is an electrical defect in the array substrate according to the optical information.

In this embodiment, it includes inputting the display data of the predetermined image to the to-be-inspected array substrate; electrically connecting the first electrode of the light-emitting device to the pixel electrode of the array substrate, and inputting the predetermined electrical signal to the second electrode of the light-emitting device; acquiring the optical information of the light emitted by the light-emitting device, and determining whether there is an electrical defect in the array substrate according to the optical information. A technical solution of the present disclosure is capable of inspecting the array substrate of the OLED display substrate after the TFT has been formed, and matching the performance of the array substrate with the OLED display substrate in which the organic light-emitting layer has been subjected to the evaporation process, thereby conveniently predicting performance of the OLED display substrate in which the organic light-emitting layer has been subjected to the evaporation process. When it is predicted that the performance of the OLED display substrate cannot meet requirements, the array substrate can be intercepted, so as to prevent from subjecting the organic light-emitting layer to the evaporation process on a defective array substrate, and thereby saving production cost of the OLED display substrate.

Further, the light-emitting device includes a plurality of groups of light-emitting units, each of the groups of light-emitting units includes a plurality of light-emitting units capable of emitting lights in different colors respectively, and the lights emitted by the plurality of light-emitting units in each of the groups of light-emitting units are enabled to be mixed into white light. Specifically, each of the groups of light-emitting units of the light-emitting device includes a red-light-emitting unit, a blue-light-emitting unit, and a green-light-emitting unit.

Wherein, an area of the light-emitting device may be equal to an area of the to-be-inspected array substrate. Alternatively, to save cost, the area of the light-emitting device may be smaller than the area of the to-be-inspected array substrate. When the area of the light-emitting device is smaller than the area of the array substrate, a partial region of the array substrate can be inspected by using the light-emitting device for each inspection, and inspection of all regions of the array substrate can be completed by multiple inspections.

Further, the processing circuit includes: an optical inspection device arranged at a light-emitting side of the light-emitting device, and configured to acquire optical information of the light emitted by the light-emitting device; a photoelectric conversion device connected to the optical inspection device, and configured to convert the optical information into an electrical signal; and a processor, configured to determine whether there is the electrical defect in the array substrate according to the electrical signal.

The optical inspection device may be an optical sensor, a photodiode or an image capturing device, etc. In order to reduce difficulties of an optical inspection, the display data inputted to the array substrate is preferably display data of a pure color image, including but not limited to display data of a white image, display data of a red image, display data of a green image, and display data of a blue image, etc. The acquired optical information includes, but is not limited to, wavelength of the light and intensity of the light. In order to accurately determine whether or not there is the electrical defect in the array substrate, the acquired optical information may be converted into an electrical signal by using the photoelectric conversion device, and whether there is the electrical defect in the array substrate may be determined according to the electrical signal.

In a specific embodiment, the test circuit is further configured to electrically connect the first electrode of the light-emitting device to the pixel electrode of the array substrate through a probe, the pixel electrodes are in one-to-one correspondence with the first electrodes, and each of the pixel electrodes is electrically connected to a respective one of the first electrodes.

In another specific embodiment, the light-emitting device and the array substrate are arranged in a sealed test chamber, the first electrode of the light-emitting device is oriented towards the array substrate, and a distance between the first electrode and the array substrate is less than a predetermined threshold; and the test circuit is further configured to dispose conductive particles into a space between the first electrode and the array substrate, to transmit an electrical signal of the pixel electrode of the array substrate to the first electrode through the conductive particles.

In order to ensure that the electrical signal of the pixel electrode of the array substrate can be transmitted to the first electrode through the conductive particles, the distance between the first electrode and the array substrate cannot be set too large, and the predetermined threshold may be 100 micrometers. Specifically, the distance between the first electrode and the array substrate may be 30 micrometers, 50 micrometers or 80 micrometers.

When the electrical signal of the pixel electrode in a to-be-inspected region on the array substrate is transmitted to the first electrode by using the conductive particles, in order to avoid signal interference from other regions of the array substrate, an input device of the conductive particles may be disposed beside the to-be-inspected region, input of the conductive particles may be performed from top to bottom, and input range of the conductive particles is consistent with range of the to-be-inspected region, so as to prevent signal interference coming from other regions of the array substrate from adversely affecting the to-be-inspected region.

The light-emitting device can be used to predict light-emitting effect after formation of the organic light-emitting layer on the array substrate, the light-emitting units of the light-emitting device are in one-to-one correspondence with the pixels of the array substrate, the first electrode is connected to the pixel electrode of a corresponding pixel of the array substrate, and the predetermined electrical signal is inputted to the second electrode of the light-emitting device. When the display data of the predetermined image is inputted to the array substrate, a display effect of each of the light-emitting units of the light-emitting device is equivalent to a display effect of the corresponding pixel after the organic light-emitting layer is formed on the array substrate.

If it is found through the acquired optical information that one of the light-emitting units does not emit light or its brightness is significantly lower than other light-emitting units, it can be judged that there is an electrical defect in the corresponding pixel of the array substrate. If the number of pixels with the electrical defect exceeds the predetermined value, it can be judged that the performance of the array substrate cannot meet the requirements, and the array substrate is a defective array substrate, so that the organic light-emitting layer on the defective array substrate is not subjected to an evaporation in a subsequent process, thereby avoiding waste of organic light-emitting material by subjecting the organic light-emitting layer on the defective array substrate to the evaporation process, thereby saving production cost of the OLED display substrate.

An embodiment of the present disclosure further provides a method for inspecting the array substrate, wherein the method is applied to the inspection device for the array substrate as described above, and configured to inspect the to-be-inspected array substrate, and the method includes: inputting the display data of the predetermined image to the array substrate; electrically connecting the first electrode of the light-emitting device to the pixel electrode of the array substrate, wherein the light-emitting device includes a first electrode, a second electrode, and a plurality of light-emitting units arranged between the first electrode and the second electrode, and the plurality of light-emitting units is capable of emitting light under the effect of the electric field between the first electrode and the second electrode; inputting the predetermined electrical signal to the second electrode of the light-emitting device; and acquiring the optical information of the light emitted by the light-emitting device, and determining whether there is the electrical defect in the array substrate according to the optical information.

In this embodiment, it includes inputting the display data of the predetermined image to the to-be-inspected array substrate; electrically connecting the first electrode of the light-emitting device to the pixel electrode of the array substrate, and inputting the predetermined electrical signal to the second electrode of the light-emitting device; acquiring the optical information of the light emitted by the light-emitting device, and determining whether there is an electrical defect in the array substrate according to the optical information. A technical solution of the present disclosure is capable of inspecting the array substrate of the OLED display substrate after the TFT has been formed, and matching the performance of the array substrate with the OLED display substrate in which the organic light-emitting layer has been subjected to the evaporation process, thereby conveniently predicting performance of the OLED display substrate after the organic light-emitting layer has been subjected to the evaporation process. When it is predicted that the performance of the OLED display substrate cannot meet the requirements, the array substrate can be intercepted, so as to prevent from subjecting the organic light-emitting layer to the evaporation process on the defective array substrate, and thereby saving production cost of the OLED display substrate.

Further, the light-emitting device includes a plurality of groups of light-emitting units, each of the groups of light-emitting units includes a plurality of light-emitting units capable of emitting lights in different colors respectively, and the lights emitted by the plurality of light-emitting units in each of the groups of light-emitting units are enabled to be mixed into white light. Specifically, each of the groups of light-emitting units of the light-emitting device includes a red-light-emitting unit, a blue-light-emitting unit, and a green-light-emitting unit.

The area of the light-emitting device may be equal to the area of the to-be-inspected array substrate. Alternatively, to save cost, the area of the light-emitting device may be smaller than the area of the to-be-inspected array substrate.

When the area of the light-emitting device is smaller than the area of the array substrate, the method further includes: moving the light-emitting device to a position above a first region of the array substrate, electrically connecting the first electrode of the light-emitting device to the pixel electrode of the first region, and inputting the predetermined electrical signal to the second electrode of the light-emitting device, to acquire the optical information of the light emitted by the light-emitting device; moving the light-emitting device to a position above a second region of the array substrate, electrically connecting the first electrode of the light-emitting device to the pixel electrode of the second region, and inputting the predetermined electrical signal to the second electrode of the light-emitting device, to acquire the optical information of the light emitted by the light-emitting device; and so on; and moving the light-emitting device to a position above an $N^{th}$ region of the array substrate, electrically connecting the first electrode of the light-emitting device to the pixel electrode of the $N^{th}$ region, and inputting the predetermined electrical signal to the second electrode of the light-emitting device, to acquire the optical information of the light emitted by the light-emitting device, wherein N is an integer greater than 1. The above regions ranging from the first region to the $N^{th}$ region may covers an entirety of the array substrate.

In a specific embodiment, an area of each of the above regions ranging from the first region to the $N^{th}$ region is equal to the area of the light-emitting device. Optionally, at least two of the above regions ranging from the first region to the $N^{th}$ region partially overlap each other.

In a specific embodiment, electrically connecting the first electrode of the light-emitting device to the pixel electrode of the array substrate includes: electrically connecting the first electrode of the light-emitting device and the pixel electrode of the array substrate through a probe, the pixel electrodes are in one-to-one correspondence with the first electrodes, and each of the pixel electrodes is electrically connected to a respective one of the first electrodes.

In another specific embodiment, electrically connecting the first electrode of the light-emitting device to the pixel electrode of the array substrate includes: placing the light-emitting device and the array substrate into a sealed test chamber; orienting the first electrode of the light-emitting device toward the array substrate, and enabling a distance between the first electrode and the array substrate to be less than a predetermined threshold; and disposing conductive particles in a space between the first electrode and the array substrate, to transmit the electrical signal of the pixel electrode of the array substrate to the first electrode through the conductive particles.

In order to ensure that the electrical signal of the pixel electrode of the array substrate can be transmitted to the first electrode through the conductive particles, the distance between the first electrode and the array substrate cannot be set too large, and the predetermined threshold may be 100 micrometers. Specifically, the distance between the first electrode and the array substrate may be 30 micrometers, 50 micrometers or 80 micrometers.

The light-emitting device can be used to predict light-emitting effect after formation of the organic light-emitting layer on the array substrate, the light-emitting units of the light-emitting device are in one-to-one correspondence with the pixels of the array substrate, the first electrode is connected to the pixel electrode of a corresponding pixel of the array substrate, and the predetermined electrical signal is inputted to the second electrode of the light-emitting device. When the display data of the predetermined image is inputted to the array substrate, a display effect of each of the light-emitting units of the light-emitting device is equivalent to a display effect of the corresponding pixel after the organic light-emitting layer is formed on the array substrate. If it is found through the acquired optical information that one of the light-emitting units does not emit light or its brightness is significantly lower than other light-emitting units, it can be judged that there is an electrical defect in the corresponding pixel of the array substrate. If the number of pixels with the electrical defect exceeds the predetermined value, it can be judged that the performance of the array substrate cannot meet the requirements, and the array substrate is a defective array substrate, so that the organic light-emitting layer on the defective array substrate is not subjected to an evaporation process in a subsequent process, thereby avoiding waste of organic light-emitting material by subjecting the organic light-emitting layer on the defective array substrate to the evaporation process, thereby saving production cost of the OLED display substrate.

The optical information of the light emitted by the light-emitting device can be acquired by using the optical inspection device disposed at the light-emitting side of the light-emitting device, and the optical inspection device may be an optical sensor, a photodiode or an image capturing device, etc. In order to reduce difficulties of an optical inspection, the display data inputted to the array substrate is preferably display data of a pure color image, including but not limited to display data of a white image, display data of a red image, display data of a green image, and display data of a blue image, etc. The acquired optical information includes, but is not limited to, wavelength of the light and intensity of the light.

Further, determining whether there is the electrical defect in the array substrate according to the optical information includes: converting the optical information into the electrical signal by using a photoelectric conversion device, and determining whether there is the electrical defect in the array substrate according to the electrical signal.

In order to accurately determine whether there is the electrical defect in the array substrate, the acquired optical information can be converted into the electrical signal by using the photoelectric conversion device, and whether there is the electrical defect in the array substrate is determined according to the electrical signal.

The technical solutions of the present disclosure are further described below in conjunction with the accompanying drawings and specific embodiments:

As shown in FIG. 1, the inspection device for the array substrate of the present embodiment includes a driving circuit 2 connected to a to-be-inspected array substrate 1, and the driving circuit 2 inputs the display data of the predetermined image to the array substrate 1. In this embodiment, The drive circuit 2 sequentially inputs to the array substrate 1 the display data of the white image, the display data of the red image, the display data of the blue image, and the display data of the green image; a light-emitting device 3 arranged above the array substrate 1, as shown in FIG. 2, includes a first electrode 31, a second electrode 32, and a plurality of light-emitting units 33 arranged between the first electrode 31 and the second electrode 32. The light-emitting unit 33 includes a red-light-emitting unit 33R, a green-light-emitting unit 33G and a blue-light-emitting unit 33B. The light-emitting unit 33 can emit light under the effect of the electric field between the first electrode 31 and the second electrode 33. Alternatively, as shown in FIG. 5, the light-emitting device 3 may include a plurality of groups of light-emitting units, each of the groups of light-emitting units includes the red-light-emitting unit 33R, the green-light-emitting unit 33G, and the blue-light-emitting unit 33B. In this embodiment, the first electrode 31 is made of a reflective and conductive material, e.g., ITO (Indium Tin Oxide)/Ag/ITO, and the second electrode 32 is made of a transparent and conductive material, e.g., ITO or IZO (Indium Zinc Oxide), and the light emitted by the light-emitting unit 33 is transmitted through the second electrode 32. The inspection device for the array substrate of this embodiment further includes a test circuit 4 that disposes conductive particles 41 into a space between the array substrate 1 and the light-emitting device 3 arranged in the sealed test chamber 7 as shown in FIG. 4. The conductive particles 41 transmit an electrical signal on the pixel electrode 6 on the array substrate 1 to the first electrode 31, and the test circuit 4 also inputs a predetermined electrical signal to the second electrode 32, such that the electric field is generated between the first electrode 31 and the second electrode 32 to drive the light-emitting unit 33 to emit the light. For example, the connection of the light-emitting device 3 and the test circuit 4 shown in FIG. 1 can be as follows: the first electrode 31 of the light-emitting device 3 is connected to the test circuit 4 through a probe. The inspection device for the array substrate of the present embodiment further includes a processing circuit, wherein the processing circuit includes: an optical inspection device 51 arranged at a side of the second electrode 32, and configured to acquire optical information of the light emitted by the light-emitting unit 33; a photoelectric conversion device 52 connected to the optical inspection device 51, and configured to convert the optical information into an electrical signal; and a processor 53 connected to the photoelectric conversion device 52, and configured to determine whether there is the electrical defect in the array substrate according to the electrical signal.

In the embodiment, during a process of inspecting the array substrate, a voltage is applied to the pixel electrode 6 of the array substrate through the driving circuit, and the voltage is transmitted to the first electrode 31 through the conductive particles 41. Because there is a voltage difference between the first electrode 31 and the second electrode 32, light is emitted by the light-emitting unit 33. Through collecting information such as the intensity, wavelength, and the like of the light emitted by the light-emitting unit 33, and converting the optical information into the electrical signal by the photoelectric conversion device 52, a value of the voltage at each pixel electrode 6 can be acquired, and an electrical image of the array substrate is outputted; and the optical image of the pixels of different colors of the array substrate can be outputted by separately analyzing each of red light, blue light and green light emitted by the light-emitting device. The array substrate with preferable electrical properties can be selected according to the electrical image and the optical image, so as to enable evaporation of the organic light-emitting layer of the array substrate. In this embodiment, the array substrate is selected by simulating an RGBW light emitted by the OLED display substrate in which the organic light-emitting layer has been subjected to the evaporation process, it is possible to effectively predict a defective state such as a defective state where the OLED display substrate displays a RGBW image and a dot line mura (bright spot) after evaporation of the organic light-emitting layer, thereby effectively intercepting the defective array substrate.

In this embodiment, as shown in FIG. 3, an area of the optical device 3 is smaller than an area of the to-be-inspected array substrate 1, and the array substrate 1 can be divided into N regions, the area of each region is equal to the area of the optical device 3. Firstly the optical device 3 is moved to a position above the first region 11 of the array substrate 1, and the first region 11 is inspected by the optical device 3, after which the optical device 3 can be moved to a position above the second region of the array substrate 1, and the second region is inspected by the optical device 3, and so on. The inspection of the entire region of the array substrate 1 can be completed by N times of the above inspection.

In this embodiment, the light-emitting device can be used to predict light-emitting effect after formation of the organic light-emitting layer on the array substrate, and match performance of the array substrate with the OLED display substrate in which an organic light-emitting layer has been subjected to the evaporation process. When the display data of the white image is inputted to the array substrate, the display effect of each light-emitting unit of the light-emitting device is equivalent to that of the corresponding pixel after the organic light-emitting layer is formed on the array substrate. If it is found through the acquired optical information that one of the light-emitting units does not emit light or its brightness is significantly lower than other light-emitting units, it can be judged that there is the electrical defect in the corresponding pixel of the array substrate. If the number of pixels with the electrical defect exceeds the predetermined value, it can be judged that the performance of the array substrate cannot meet the requirements, and the array substrate is a defective array substrate, the defective array substrates can be intercepted and prevent from entering a subsequent process, so that the organic light-emitting layer is not subjected to an evaporation process on the defective array substrate in the subsequent process, thereby avoiding waste of organic light-emitting material by evaporating the organic light-emitting layer on the defective array substrate, thereby saving production cost of the OLED display substrate.

Unless otherwise defined, technical terms or scientific terms used in the present disclosure shall be of ordinary meaning as understood by those of ordinary skill in the art to which the disclosure belongs. The words "first", "second" and similar terms used in the present disclosure do not denote any order, quantity, or importance, but are used to distinguish different components. The word "including" or "comprising" or the like means that an element or an item preceding the word includes an element or an item listed after the word and its equivalent, without excluding other components or objects. The words "connecting" or "connected" or the like are not limited to physical or mechanical connections, but may include electrical connections, whether direct or indirect. "Upper", "lower", "left", "right", etc. are only used to indicate relative positional relationship, and when the absolute position of the object to be described is changed, relative positional relationship may also be changed accordingly.

It will be understood that when an element such as a layer, a film, a region or a substrate is referred to as being "on" or "under" another element, the element may be "directly" "on" or "under" another element, or an intermediate element may be present between them.

The above are merely preferred embodiments of the present disclosure, and it should be noted that those skilled in the art can make various improvements and modifications without departing from principles of the present disclosure, and these improvements and modifications should also be considered as falling into the protection scope of the present disclosure.

What is claimed is:

1. An inspection device for an array substrate, wherein the inspection device is configured to inspect a to-be-inspected array substrate, and comprises:
    a driving circuit, configured to input display data of an image to a pixel electrode of the array substrate;
    a light-emitting device, wherein the light-emitting device comprises a first electrode, a second electrode, and a plurality of light-emitting units arranged between the first electrode and the second electrode, and the plurality of light-emitting units is capable of emitting light under the effect of an electric field between the first electrode and the second electrode;
    a test circuit, configured to electrically connect the first electrode of the light-emitting device to the pixel electrode of the array substrate, and input a first electrical signal to the second electrode of the light-emitting device, to generate the electric field between the first electrode and the second electrode; and
    a processing circuit, configured to acquire optical information of the light emitted by the light-emitting device, and determine whether there is an electrical defect in the array substrate according to the optical information.

2. The inspection device for the array substrate according to claim 1, wherein the processing circuit comprises:
    an optical inspection device arranged at a light-emitting side of the light-emitting device, and configured to acquire optical information of the light emitted by the light-emitting device;
    a photoelectric conversion device connected to the optical inspection device, and configured to convert the optical information into a second electrical signal; and
    a processor, configured to determine whether there is the electrical defect in the array substrate according to the second electrical signal.

3. The inspection device for the array substrate according to claim 2, wherein
    the light-emitting device comprises a plurality of groups of light-emitting units, each of the groups of light-emitting units comprises a plurality of light-emitting units capable of emitting lights in different colors respectively, and the lights emitted by the plurality of light-emitting units in each of the groups of light-emitting units are enabled to be mixed into white light; and
    the optical inspection device configured to acquire the optical information of the light emitted by the light-emitting device is further configured to acquire the optical information of the white light.

4. The inspection device for the array substrate according to claim 3, wherein
    each of the groups of light-emitting units comprises a red-light-emitting unit, a blue-light-emitting unit, and a green-light-emitting unit.

5. The inspection device for the array substrate according to claim 1, wherein
    the test circuit is further configured to electrically connect the first electrode of the light-emitting device to the pixel electrode of the array substrate through a probe, the pixel electrodes are in one-to-one correspondence with the first electrodes, and each of the pixel electrodes is electrically connected to a respective one of the first electrodes.

6. The inspection device for the array substrate according to claim 1, wherein
    the light-emitting device and the array substrate are arranged in a sealed test chamber, the first electrode of the light-emitting device is oriented towards the array substrate, and a distance between the first electrode and the array substrate is less than a threshold; and
    the test circuit is further configured to dispose conductive particles into a space between the first electrode and the array substrate, to transmit a third electrical signal of the pixel electrode of the array substrate to the first electrode through the conductive particles.

7. The inspection device for the array substrate according to claim 1, wherein
    the first electrode is made of a reflective and conductive material, the second electrode is made of a transparent and conductive material, and the light emitted by the light-emitting unit is transmitted through the second electrode.

8. A method for inspecting an array substrate, wherein the method is applied to the inspection device for the array substrate according to claim 1, and configured to inspect the to-be-inspected array substrate, and the method comprises:
    inputting the display data of the image to the pixel electrode of the array substrate;
    electrically connecting the first electrode of the light-emitting device to the pixel electrode of the array substrate, and inputting the first electrical signal to the second electrode of the light-emitting device, to generate the electric field between the first electrode and the second electrode to drive the light-emitting device to emit the light; and
    acquiring the optical information of the light emitted by the light-emitting device, and determining whether there is the electrical defect in the array substrate according to the optical information.

9. The method according to claim 8, wherein an area of the light-emitting device is smaller than an area of the array substrate, and the method further comprises:
    dividing the area of the array substrate into a plurality of sub-regions of the array substrate; and
    with respect to each of the plurality of sub-regions, moving the light-emitting device to a position above the sub-region, electrically connecting the first electrode of the light-emitting device to the pixel electrode of the sub-region, and inputting the first electrical signal to the second electrode of the light-emitting device, to acquire the optical information of the light emitted by the light-emitting device.

10. The method according to claim 9, wherein
    an area of each of the plurality of sub-regions is equal to an area of the light-emitting device.

11. The method according to claim 10, wherein
    at least two of the plurality of sub-regions partially overlap each other.

12. The method according to claim 8, wherein electrically connecting the first electrode of the light-emitting device to the pixel electrode of the array substrate comprises:
    electrically connecting the first electrode of the light-emitting device to the pixel electrode of the array substrate through a probe, the pixel electrodes are in one-to-one correspondence with the first electrodes, and each of the pixel electrodes is electrically connected to a respective one of the first electrodes.

13. The method according to claim 8, wherein electrically connecting the first electrode of the light-emitting device to the pixel electrode of the array substrate comprises:
   placing the light-emitting device and the array substrate into a sealed test chamber;
   orienting the first electrode of the light-emitting device toward the array substrate, and enabling a distance between the first electrode and the array substrate to be less than a threshold; and
   disposing conductive particles in a space between the first electrode and the array substrate, to transmit a third electrical signal of the pixel electrode of the array substrate to the first electrode through the conductive particles.

14. The method according to claim 8, wherein determining whether there is the electrical defect in the array substrate according to the optical information comprises:
   converting the optical information into a second electrical signal by using a photoelectric conversion device, and determining whether there is the electrical defect in the array substrate according to the second electrical signal.

* * * * *